United States Patent [19]
Azuma

[11] Patent Number: 5,678,214
[45] Date of Patent: Oct. 14, 1997

[54] RF RECEIVER USING IF AMPLIFIER OPERATIVE DURING LOW LEVEL RECEPTION

[75] Inventor: Tomohiro Azuma, Tokyo, Japan

[73] Assignee: NEC Corporation, Tokyo, Japan

[21] Appl. No.: 364,172

[22] Filed: Dec. 27, 1994

[30] Foreign Application Priority Data

Dec. 24, 1993 [JP] Japan ................ 5-326665

[51] Int. Cl.⁶ ........................... H04B 1/16
[52] U.S. Cl. ............. 455/217; 455/235.1; 455/250.1; 455/254; 455/266; 455/341
[58] Field of Search .................. 455/214, 217, 455/222, 225, 235.1, 247.1, 250.1, 253.1, 254, 266, 296, 303, 311, 312, 337, 338, 341

[56] References Cited

U.S. PATENT DOCUMENTS

| | | | |
|---|---|---|---|
| 5,230,096 | 7/1993 | Davies | 455/217 |
| 5,241,697 | 8/1993 | Hansen | 455/266 |

FOREIGN PATENT DOCUMENTS

| | | | |
|---|---|---|---|
| A-0 571 079 | 11/1993 | European Pat. Off. | |
| JA0067923 | 3/1988 | Japan | 455/266 |
| JA0117119 | 8/1991 | Japan | 455/250.1 |
| 404048825 | 2/1992 | Japan | 455/254 |
| 405083152 | 4/1993 | Japan | 455/250.1 |
| A-2 204 200 | 11/1988 | United Kingdom | |
| A-2 250 403 | 6/1992 | United Kingdom | |

*Primary Examiner*—Reinhard J. Eisenzopf
*Assistant Examiner*—Thanh Le
*Attorney, Agent, or Firm*—Foley & Lardner

[57] ABSTRACT

In a radio-frequency receiver, a received RF signal is converted to an intermediate frequency (IF) signal and band-limited by a first IF filter to a channel bandwidth. The level of the output of the IF filter is detected by a detector and compared with a threshold to produce a first and a second output when the detected level is lower or higher than the threshold, respectively. A switching circuit applies the output of the IF filter to a demodulator via an IF amplifier in response to the first output and directly applies it to the demodulator in response to the second output. To prevent interference from adjacent channels, a second intermediate frequency filter is connected between the band-limiting IF filter and the detector. The second IF filter has a passband corresponding to a center frequency portion of the passband of the band-limiting IF filter.

2 Claims, 2 Drawing Sheets

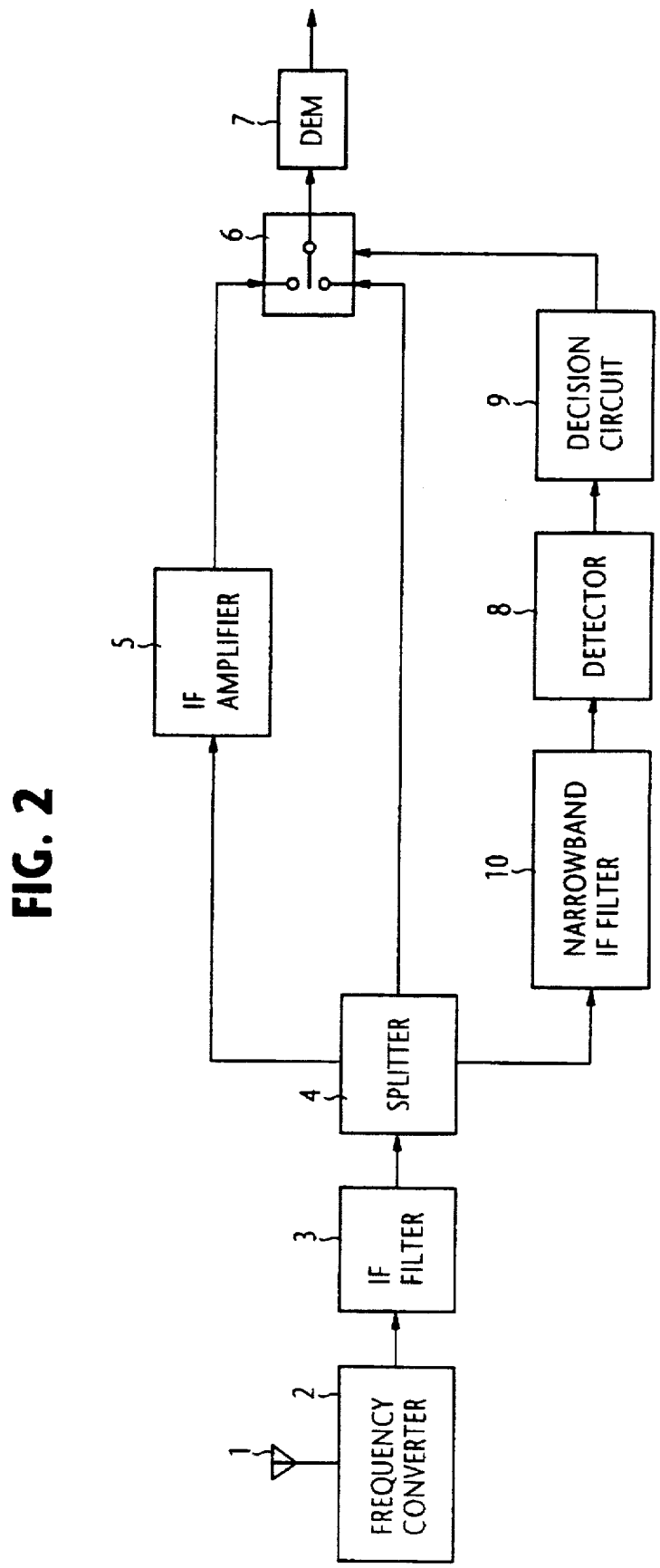

RF RECEIVER USING IF AMPLIFIER OPERATIVE DURING LOW LEVEL RECEPTION

BACKGROUND OF THE INVENTION

1. Field of the Invention

The present invention relates generally to radio-frequency receivers, and more specifically to a technique for avoiding the saturation of an intermediate-frequency demodulator during high level reception while giving a sufficient input power to the demodulator during low level reception.

2. Description of the Related Art

A radio-frequency receiver includes a frequency converter for converting a received RF signal to an intermediate frequency signal. An intermediate-frequency filter is coupled to the frequency converter for limiting the IF signal to the bandwidth of a communication channel. The band-limited signal is applied to a demodulator where the signal is processed to recover the original baseband frequency signal. However, due to multipath fading and other causes, the transmitted signal is affected and its strength changes appreciably.

SUMMARY OF THE INVENTION

It is therefore an object of the present invention to provide a radio-frequency receiver capable of compensating for varying levels of a received signal.

According to the present invention, there is provided a radio-frequency receiver comprising a frequency converter for converting a received radio-frequency signal to an intermediate frequency signal, an intermediate frequency filter connected to the frequency converter for band-limiting the intermediate frequency signal to the bandwidth of a communication channel, and an intermediate frequency amplifier. A detector is connected to the intermediate frequency filter for detecting the level of the intermediate frequency signal. A decision circuit compares the detected level to a threshold and produces a first output when the detected level is lower than the threshold and a second output when the detected level is higher than the threshold. A switching circuit is provided for applying the intermediate frequency signal from the intermediate frequency filter to a demodulator via the intermediate frequency amplifier in response to the first output of the decision circuit and directly applying the intermediate frequency signal from the intermediate frequency filter to the demodulator in response to the second output of the decision circuit.

To prevent interference from adjacent communication channels, the receiver further includes a second intermediate frequency filter which is connected between the band-limiting intermediate frequency filter and the detector. The second intermediate frequency filter has a passband corresponding to a center frequency portion of the passband of the band-limiting intermediate frequency filter.

BRIEF DESCRIPTION OF THE DRAWINGS

The present invention will be described in further detail with reference to the accompanying drawings, in which:

FIG. 2 is a block diagram of a radio-frequency receiver according to a second embodiment of the present invention.

DETAILED DESCRIPTION

Figure 1:
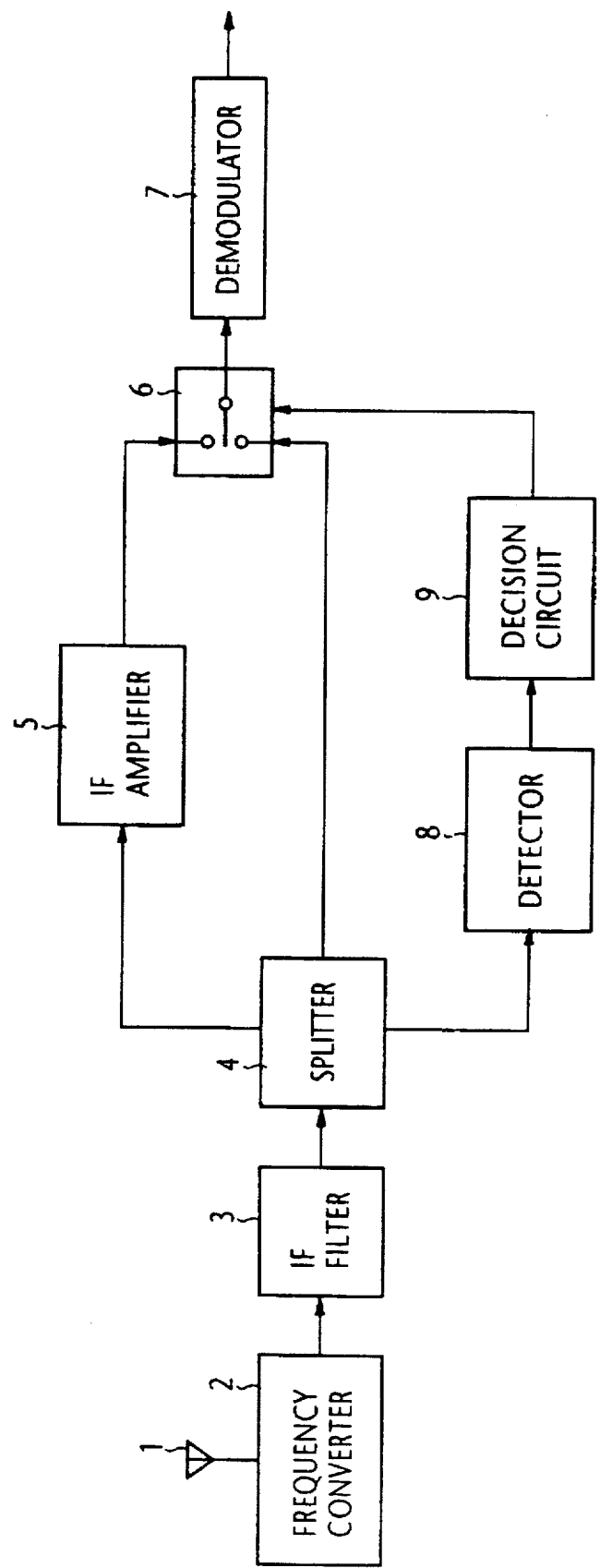
FIG. 1 is a block diagram of a radio-frequency receiver according to a first embodiment of the present invention.

In FIG. 1, an RF receiver of the invention includes a frequency converter 2 for receiving a modulated radio-frequency signal. The signal is detected by an antenna 1 and the signal is converted to a range of intermediate frequencies. The output of frequency converter 2 is applied to an intermediate-frequency bandpass filter 3 where the signal is band-limited. The band-limited signal is applied to a splitter 4 where is divides into three branches. One of the branches is supplied to an IF amplifier 5 where it is amplified and fed to the upper terminal of a switch 6. The second branch is applied to the lower terminal of the switch 6. The third branch of the splitter 4 is applied to a detector 8 where the envelope of the band-limited signal is detected and averaged out to produce a signal indicating the strength of the incoming signal. The strength indicating signal is applied to a decision circuit 9 where it is compared to a threshold. If the decision circuit 9 determines that the incoming signal is lower than the threshold, it causes the switch 6 to couple the output of IF amplifier 5 to a demodulator 7. If the decision circuit 9 determines otherwise, the switch is caused to connect the output of IF filter 3, i.e., the second branch of splitter 4, to the demodulator 7. The threshold of decision circuit 9 is determined such that it is equal to or somewhat smaller than an output level of the detector 8 which would be produced if the demodulator 7 were to be supplied with the output of IF amplifier 5 and saturated. With the switched connection of the output of IF filter 3 to the demodulator 7 depending on the average level of the IF signal, a full range of incoming signals is received without causing a saturation to the demodulator 7.

In order to ensure full-range receptivity to the signal of a desired channel, the IF filter 3 has a flat response over the frequency range of the desired channel. However, the filter 3 has roll-off decays that extend into adjacent channels. If the desired signal is relatively weaker than the signal of an adjacent channel, there is a possibility that the undesired signal will be detected by detector 8 and the average level of this signal exceeds the threshold of the decision circuit 9, causing the switch 6 to move to the lower position, directly coupling the low-level desired signal at the output of IF filter 3 to demodulator 7.

A second embodiment of the present invention is to solve the interference problem. As shown in FIG. 2, the RF receiver additionally includes a narrowband IF filter 10 between the third branch of splitter 4 and the detector 8. The filter 10 has such a narrow band corresponding to a center portion of the passband of the IF filter 3 so that only a center frequency portion of the desired signal is allowed to pass through to the detector 8. Undesired signals of adjacent channels are completely rejected at the input of detector 8. Since the desired signal that is applied to the detector 8 is not used as the input of demodulator 7, the frequency cutoff of the sideband portions of this signal by the narrowband filter 10 has no adverse effect on the quality of the output of demodulator 7.

If an undesired signal of relatively high level and a relatively low desired signal are simultaneously received, a sideband frequency portion of the undesired signal will pass through the IF filter 3 together with the full range of the low-level desired signal. However, the undesired signal is rejected by the narrowband filter 10, while the low level desired signal is allowed to pass through the filter 10 to the detector 8. Because of the low level of the desired signal, the decision circuit 9 causes the switch 6 to couple the output of IF amplifier 5 to the demodulator 7. The amplitude of the low-level desired signal is therefore compensated for by the IF amplifier 5.

What is claimed is:

1. A radio-frequency receiver comprising:

a frequency converter for converting a received radio-frequency signal to an intermediate frequency signal;

an intermediate frequency filter connected to said frequency converter, the filter having a passband which band-limits said intermediate frequency signal to the bandwidth of a communication channel;

an intermediate frequency amplifier;

detector means connected to said intermediate frequency filter for detecting the level of said intermediate frequency signal;

decision means for comparing the detected level to a threshold and producing a first output when the detected level is lower than the threshold and a second output when the detected level is higher than the threshold;

a demodulator; and switch means for applying the intermediate frequency signal from said intermediate frequency filter to said demodulator via said intermediate frequency amplifier in response to said first output of the decision means and directly applying the intermediate frequency signal from said intermediate frequency filter to said demodulator in response to said second output of the decision means.

2. A radio-frequency receiver comprising:

a frequency converter for converting a received radio-frequency signal to an intermediate frequency signal;

a first intermediate frequency filter connected to said frequency converter, the first intermediate frequency filter having a passband which band-limits said intermediate frequency signal to the bandwidth of a communication channel;

an intermediate frequency amplifier;

a second intermediate frequency filter having a passband narrower than the passband of the first intermediate frequency filter for detecting a center frequency portion of the bandwidth of said intermediate frequency signal;

detector means connected to said second intermediate frequency filter for detecting the level of the detected center frequency portion;

decision means for comparing the detected level to a threshold and producing a first output when the detected level is lower than the threshold and a second output when the detected level is higher than the threshold;

a demodulator; and switch means for applying the band-limited intermediate frequency signal from said first intermediate frequency filter to said demodulator via said intermediate frequency amplifier in response to said first output of the decision means and directly applying the band-limited intermediate frequency signal to said demodulator in response to said second output of the decision means.

* * * * *